United States Patent [19]

King

[11] Patent Number: 5,005,008
[45] Date of Patent: Apr. 2, 1991

[54] METHOD AND APPARATUS FOR PROVIDING THERMODYNAMIC PROTECTION OF A DRIVER CIRCUIT USED IN AN IN-CIRCUIT TESTER

[75] Inventor: Philip N. King, Fort Collins, Colo.

[73] Assignee: Hewlett Packard Company, Palo Alto, Calif.

[21] Appl. No.: 544,024

[22] Filed: Jun. 26, 1990

Related U.S. Application Data

[63] Continuation of Ser. No. 340,993, Apr. 20, 1989, abandoned.

[51] Int. Cl.⁵ .............................................. G08B 21/00
[52] U.S. Cl. ............................. 340/653; 324/158 T; 324/158 SC; 361/79; 364/483
[58] Field of Search .............. 340/660, 664, 644, 653; 324/81, 158 T, 158 SC, 158 SM; 361/79, 56, 57; 307/126; 364/483

[56] References Cited

U.S. PATENT DOCUMENTS

| | | | |
|---|---|---|---|
| 3,781,689 | 12/1973 | Marshall et al. | 307/254 |
| 3,937,937 | 2/1976 | McVey | 361/81 |
| 3,965,468 | 6/1976 | Bronson | 340/331 |
| 4,001,649 | 1/1977 | Young | 340/664 |
| 4,106,071 | 8/1978 | Sun et al. | 361/79 |
| 4,333,118 | 6/1982 | Comstedt et al. | 361/79 |
| 4,357,574 | 11/1982 | Takamisawa et al. | 324/426 |
| 4,473,338 | 9/1984 | Garmong | 307/141 |
| 4,588,945 | 5/1986 | Groves et al. | 324/73 R |
| 4,839,819 | 6/1989 | Begin et al. | 364/483 |
| 4,937,697 | 6/1990 | Edwards | 361/79 |

FOREIGN PATENT DOCUMENTS 1057891 11/1983 U.S.S.R. ................ 324/158 SC

OTHER PUBLICATIONS

*IBM Tech Discl. Bulltn*, "Peak Power Detection Ckt", Higuchi et al.; vol. 17, #12, 5/75, pp. 3724–3725.

Primary Examiner—Joseph A. Orsino
Assistant Examiner—Jill Jackson

[57] ABSTRACT

An apparatus for preventing damage to the output stage of a driver circuit for use in an overdrive/functional tester, while the output stage is providing logic high or logic low signals, is shown to include a first sensor for sensing the current in the output stage, a second sensor for sensing the voltage in the output stage, a multiplier for multiplying the sensed current with the sensed voltage to determine the power dissipated in the output stage, a filter to account for thermal/time characteristics in the determined power dissipated and a comparator for comparing the filtered power with a power reference value and for generating an indication signal reflective of such comparison.

7 Claims, 1 Drawing Sheet

METHOD AND APPARATUS FOR PROVIDING THERMODYNAMIC PROTECTION OF A DRIVER CIRCUIT USED IN AN IN-CIRCUIT TESTER

This is a continuation of application Ser. No. 340,993, filed Apr. 20, 1989, now abandoned.

FIELD OF THE INVENTION

The present invention relates to the field of circuit testing and more particularly to the field of "in-circuit" testing of digital devices and functional testing of digital devices.

BACKGROUND OF THE INVENTION

As the use and complexity of digital circuits has increased in approximately the last decade, so also has the need to test such circuits increased in order to ensure proper operation. Basically, two types of digital circuit test techniques have been developed, namely functional test techniques and so-called in-circuit test techniques.

In functional test techniques a known digital pattern is applied to the circuit input and a comparison is made of the circuit output with an expected output. The differences between the actual and expected outputs provides an indication of circuit operation. Unfortunately, this technique is only useful when it is desirable to know the overall operation of a circuit, for example a circuit which has been assembled onto a printed circuit board. Very often it is desirable to test individual circuit elements or groups of elements which have been assembled onto a printed circuit board apart from the overall circuit operation.

In in-circuit testing techniques, testing is performed on a circuit element or elements isolated from the remainder of the circuit. In-circuit testing techniques generally involve the application of a preselected digital pattern to the input of an individual circuit element, a so-called device under test (DUT), and the comparison of the DUT response to an expected response. Since the circuit element or elements under test typically are connected to other circuit elements, it is required to overdrive any digital pattern or signal which is being applied by an "upstream" circuit element or logic device. Upstream logic devices are those devices whose outputs normally drive the inputs of the DUT. An overdrive signal is a signal which is superimposed at a selected location in a circuit.

In order to perform multiple simultaneous in-circuit tests on several individual circuit elements mounted on a single printed circuit board, test devices such as that disclosed in U.S. Pat. No. 4,588,945 were developed. In such devices a printed circuit board having circuit elements mounted thereon is in turn mounted or affixed to a so-called bed of nails. Each nail acts as an individual probe either providing a preselected signal to or receiving an output signal from a DUT. As described in that patent, a controller module applies multiple pregenerated signal patterns to multiple DUTs through a driver module. The DUT responses are received through a sensor module and compared to expected responses.

Although it was recognized that while the driver module was to have the ability of overdriving control signals from upstream devices, damage to individual DUTs or to upstream devices could result from such overdriving. The need for in-circuit testing devices, nevertheless, remained high for three primary reasons. First, such testing techniques were effective in finding faults which occur most commonly during circuit board assembly, i.e., solder shorts, wrongly inserted components, damaged or marginal components, missing components. Second, in-circuit testing can be easily accomplished in the sense that pregenerated test patterns could be stored in memory libraries so that a test program could include a series of already generated and stored patterns. Finally, in-circuit testing remained popular because it inherently produced component level diagnostic messages. Sophisticated backtracing routines were not needed to determine with significant probability that a component or components would fail during operation. In U.S. Pat. No. 4,588,945 methods and apparatus are disclosed which prevent damage to such DUTs or upstream devices.

The present invention focuses on improvements to the driver module circuitry of in-circuit testing devices such as that disclosed in U.S. Pat. No. 4,588,945 and of functional testing devices. As discussed in that patent, the driver module is made up of a multiplicity of identical driver circuits which generate the actual voltage signals provided to selected probes or nails in the test bed or bed of nails. These circuits each provide logic high, logic low and an "off" state, i.e., the so-called tri-state. Unfortunately, these driver circuits have experienced problems associated with circuit protection, primarily related to the protection of the driver circuit output transistors from damage caused by exceeding current and power limits. It should be noted that DUTs and upstream devices can cool after an in-circuit test. Consequently, upstream devices may recover from the excessive power dissipation caused by overdriving prior to the next operation. Since the driver circuit is used repeatedly in relation to different nails or test points, if the power limits of such a driver circuit are exceeded, damage may result because no recovery has been allowed to occur. Previously, typical solutions to this problem have involved varying supply voltages to follow desired output levels, current limiting, and duty cycle limiting. Unfortunately these solutions not only involved the incorporation of expensive adjustable power supplies, for overdrive purposes, but also involved limiting current below that required for certain conditions, while often not protecting the circuit during fault conditions.

SUMMARY OF THE INVENTION

The advantages of the invention are achieved in an apparatus for preventing damage to the output stage of a driver circuit for use in an overdrive/functional tester, while the output stage is providing logic high or logic low signals. The invention includes a first sensor for sensing the current in the output stage, a second sensor for sensing the voltage in the output stage, a multiplier for multiplying the sensed current with the sensed voltage to determine the power dissipated in the output stage, a compensator to account for thermal/time characteristics in the determined power dissipated and a comparator for comparing the compensated power with a power reference value and for generating an indication signal reflective of such comparison.

DETAILED DESCRIPTION

Figure 1:
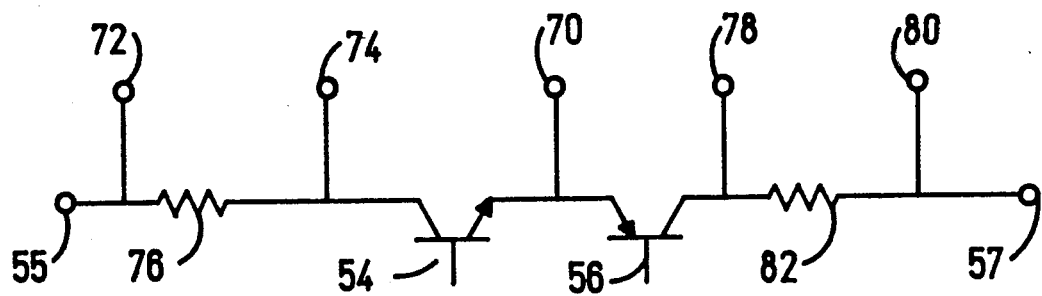
FIG. 1 schematic drawing of a driver circuit output stage in accordance with the present invention.

FIG. 1 is a schematic drawing of a driver circuit output stage in accordance with the present invention. The high current output stage is composed primarily of transistors 54 and 56. Transistors 54 and 56 are arranged in an emitter follower configuration and serve to provide the high output currents required for overdriving in in-circuit testing. In the preferred embodiment transistor 54 is a 2N4401 and transistor 56 is a 2N4403 and both are packaged in SOT-89 packages mounted on a ceramic (aluminum oxide) substrate. Other transistors may exist which can be substitutes for transistors 54 and 56 as described herein. The collector of transistor 54 is connected through a current sensing resistor to a positive supply voltage at 55 which in the preferred embodiment is a nominal 12 V. Similarly, the collector of transistor 56 is connected through a current sensing resistor to a negative supply voltage at 57 which in the preferred embodiment is a nominal negative 10 V.

Test points 72 and 74, provided on either side of resistor 76, serve to allow sensing of the current flowing to transistor 54. Similarly, test points 78 and 80, provided on either side of resistor 82, allow sensing of the current flowing from transistor 56. The purpose of such sensing will be explained in greater detail herein.

Figure 2:
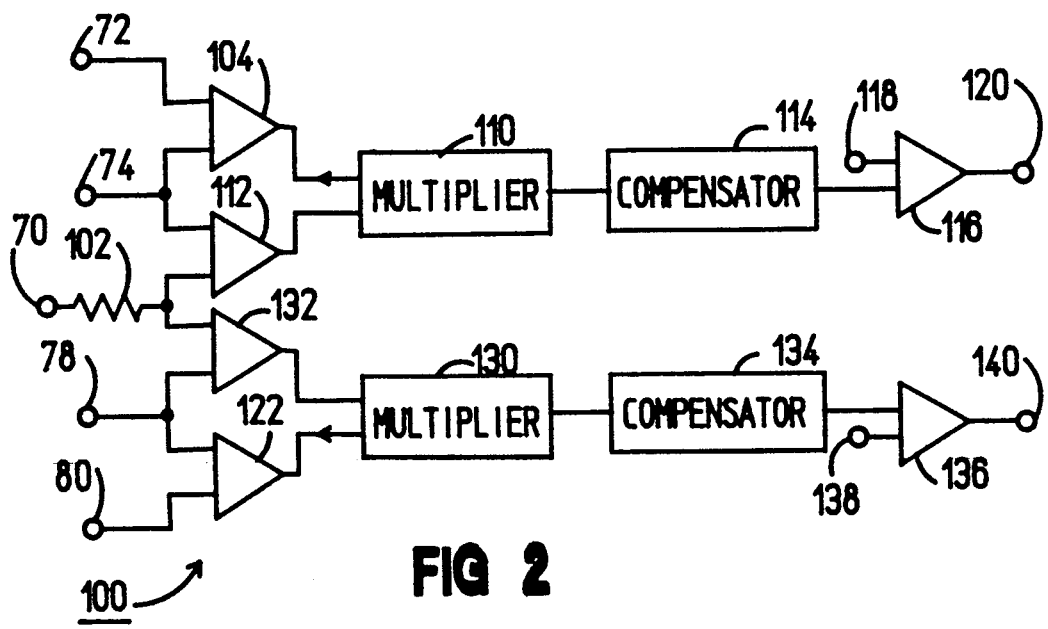
FIG. 2 is a diagrammatic drawing of a driver protection circuit in accordance with the present invention.

FIG. 2 is a diagrammatic drawing of a driver protection circuit in accordance with the present invention. The primary function of circuit 100 is to prevent output transistors 54 and 56 shown in FIG. 1 from exceeding their power limits. Such a function is achieved in the circuit shown in FIG. 2 at a lower cost and greater accuracy than prior attempts to provide this type of protection. As indicated in relation to FIG. 1, the current flowing to transistor 54 is sensed by current sensing resistor 76, which in the preferred embodiment is a one (1) ohm resistor. Such current is sensed between test points 72 and 74. Likewise the current flowing from transistor 56 is sensed by current sensing resistor 82, which is also preferred to be a one (1) ohm resistor. Such current is sensed between test points 78 and 80. By connecting resistor 102 to output 70, it is also possible to sense the voltage across transistors 54 and 56. In the preferred embodiment, resistor 102 is approximately 100 ohms. The signal at test point 72 is applied to the positive input of differential amplifier 104. The signal at test point 74 is applied to the negative input of differential amplifier 104. The output of amplifier 104 is reflective of the current flowing to transistor 54.

The sensed current signal from amplifier 104 is provided to multiplier 110. In order to determine the power level in transistor 54, it will be necessary to sense the voltage across it. To this end test point 74 and output 70 are provided to the inputs of differential amplifier 112. The output of amplifier 112 is reflective of the voltage across transistor 54. This signal is provided to multiplier 110. The output of multiplier 110, which is reflective of the instantaneous power being dissipated in transistor 54, is provided to compensator or filter 114. Filter 114 serves to account for the heating and cooling delays inherent in the operation of transistor 54. A preferred embodiment of filter 114 will be described in connection with FIG. 3. The signal from filter 114 is provided to comparator 116 which compares the filtered power reflective signal to a reference signal provided at 118. If the actual time averaged power exceeds the reference level, an indication signal is provided at output 120.

The same operation can be described for monitoring the current and power associated with transistor 56. The current sensed between test points 78 and 80 is applied to differential amplifier 122. The sensed current is provided to multiplier 130 for determining the instantaneous power being dissipated by transistor 56. The voltage across transistor 56, sensed between test point 78 and output 70 is applied to differential amplifier 132. The output of amplifier 132, being reflective of the voltage across transistor 56, is applied to the other input of multiplier 130. The output of multiplier 130 is presented to filter 134 in order to account for heating and cooling delays inherent in transistor 56. The output of filter 134 is reflective of the actual heating being experienced by transistor 56. This signal is compared by comparator 136 to a power reference signal provided at 138. If the actual time averaged power exceeds the reference level, an indication signal is provided at 140.

Figure 3:
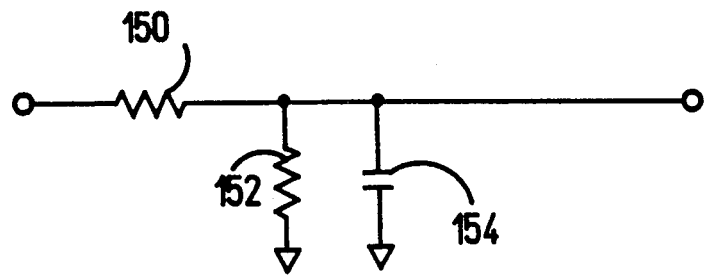
FIG. 3 is a schematic diagram of a preferred compensator for use in the circuit of FIG. 2.

FIG. 3 is a schematic diagram of a preferred compensator for use in the circuit of FIG. 2. As shown in FIG. 3, compensators 114 and 134 are composed of two resistors 150 and 152 and a capacitor 154 arranged in the shown configuration. Although many values of these components are possible their interrelationship in the preferred embodiment should be noted. It is preferred that the capacitor have a value of ten (10) micro Farads and the resistors each be equal to 10 k ohms. This electrical circuit accurately models the thermal properties of the preferred embodiment of transistors 54 and 56. In other words, the thermodynamic characteristics of the transistors are taken into account by compensators 114 and 134. As is known, transistors exhibit characteristic heat build up and decay when turned "on" and "off", i.e., when signal is applied or removed, due to power dissipation. Compensators 114 and 134, shown in FIG. 3, account for these thermodynamic characteristics by controlling the charging and discharging of capacitor 154 over time. As will be appreciated, such control is achieved by the values selected for resistors 150, 152 and capacitor 154.

It is believed that this invention is applicable to any application of a transistor and it should work equally well for both bipolar and field effect transistors.

While the invention has been described and illustrated with reference to specific embodiments, those skilled in the art will recognize that modification and variations may be made without departing from the principles of the invention as described herein above and set forth in the following claims.

What is claimed is:

1. Apparatus for maximizing operating time while preventing damage to a transistor, or similar active device, contained in the output stage of a driver circuit in an overdrive/functional tester, comprising:

first sensing means for sensing the current in said output stage transistor, or similar active device;

second sensing means for sensing the voltage in said output stage transistor, or similar active device;

multiplication means for multiplying said sensed current with said sensed voltage and for generating a power signal representative of such multiplication;

thermodynamic model means, connected to receive said power signal, for compensating said power signal to account for the thermodynamic characteristics of said transistor, or similar active device, so that comparison of said power signal to a power reference value does not result in an indication of excessive dissipated power during heat build up in said transistor or an indication that said transistor is ready to dissipate power during heat decay; and comparison means for comparing the compensated power signal with a power reference value and for generating an indication signal reflective of said comparison.

2. The apparatus of claim 1, wherein said thermodynamic model means accounts for time/thermal delays inherent in said output stage.

3. The apparatus of claim 1, wherein said thermodynamic model means comprises a first resistor and a capacitor connected in parallel and a second resistor connected in series with the parallel connection.

4. The apparatus of claim 1, wherein said first sensing means comprises a current sensing resistor in said output stage and a differential amplifier having its inputs connected to both ends of said current sensing resistor.

5. The apparatus of claim 1, wherein said output stage comprises at least one transistor and wherein said second sensing means comprises a differential amplifier having its inputs connected to the collector and emitter of said transistor when said transistor is a bipolar device.

6. The apparatus of claim 1, wherein said output stage comprises at least one transistor and wherein said second sensing means comprises a differential amplifier having its inputs connected to the source and drain of said transistor when said transistor is a field effect transistor.

7. A method for preventing damage to the output stage of a driver circuit used in an overdrive/functional tester, while said output stage is providing logic high or logic low signals, comprising the steps of:

sensing the current in said output stage;

sensing the voltage in said output stage;

multiplying said sensed current with said sensed voltage to determine the power dissipated in said output stage;

compensating the power determined to have been dissipated in said output stage to account for the thermodynamic characteristics of said output stage; and comparing the compensated power with a power reference value and generating an indication signal reflective of said comparison.

* * * * *